(12) United States Patent
Renaudin et al.

(10) Patent No.: US 8,171,330 B2
(45) Date of Patent: May 1, 2012

(54) ASYNCHRONOUS CIRCUIT INSENSITIVE TO DELAYS WITH TIME DELAY INSERTION CIRCUIT

(75) Inventors: Marc Renaudin, Biviers (FR); Ghislain Bouesse, Meylan (FR)

(73) Assignee: Tiempo, Montbonnot St-Martin (FR)

( * ) Notice: Subject to any disclaimer, the term of this patent is extended or adjusted under 35 U.S.C. 154(b) by 456 days.

(21) Appl. No.: 12/453,826

(22) Filed: May 22, 2009

(65) Prior Publication Data
US 2009/0307516 A1    Dec. 10, 2009

(30) Foreign Application Priority Data

Jun. 6, 2008  (FR) ...................................... 08 03165

(51) Int. Cl.
*G06F 1/08*    (2006.01)
*G06F 1/04*    (2006.01)

(52) U.S. Cl. ......... 713/401; 713/500; 713/501; 713/503
(58) Field of Classification Search .................... 713/401
See application file for complete search history.

(56) References Cited

U.S. PATENT DOCUMENTS

| | | | | |
|---|---|---|---|---|
| 4,330,750 A | * | 5/1982 | Mayor | ............................ 327/276 |
| 4,637,018 A | * | 1/1987 | Flora et al. | ..................... 714/700 |
| 5,553,276 A | * | 9/1996 | Dean | .............................. 713/500 |
| 6,229,364 B1 | * | 5/2001 | Dortu et al. | ................... 327/158 |
| 6,327,661 B1 | | 12/2001 | Kocher et al. | |
| 6,927,605 B2 | * | 8/2005 | Fetzer et al. | ................... 327/101 |
| 7,205,794 B2 | | 4/2007 | Anderson et al. | |
| 7,394,301 B2 | * | 7/2008 | Fetzer et al. | ................... 327/262 |
| 7,554,374 B2 | * | 6/2009 | Fairbanks | ...................... 327/175 |
| 2005/0231259 A1 | * | 10/2005 | Fetzer et al. | ................... 327/261 |
| 2008/0238509 A1 | * | 10/2008 | Fairbanks | ...................... 327/175 |

FOREIGN PATENT DOCUMENTS

| | | |
|---|---|---|
| EP | 0 913 768 A2 | 5/1999 |
| WO | WO 2006/100626 A2 | 9/2006 |

OTHER PUBLICATIONS

Sutherland, Ivan E., *Micropipelines*, Communications of the ACM, Jun. 1, 1989, vol. 32 No. 6, New York.

* cited by examiner

*Primary Examiner* — Ryan Stiglic
(74) *Attorney, Agent, or Firm* — Oliff & Berridge, PLC (57) ABSTRACT

The asynchronous circuit insensitive to delays comprises at least one time delay insertion circuit on the propagation path of a signal. The delay insertion circuit comprises, between an input and an output of the signal, a Muller C-element and a plurality of delay circuits connected in series to an output of the Muller C-element. The outputs of the delay circuits are connected to corresponding inputs of a multiplexing circuit having an output constituting the output of the delay insertion circuit. The Muller C-element comprises an input connected to the output of the last delay circuit via an inverter gate, and an input constituting the input of the signal to the delay insertion circuit. The multiplexing circuit control circuit preferably comprises a random generator.

6 Claims, 6 Drawing Sheets

ASYNCHRONOUS CIRCUIT INSENSITIVE TO DELAYS WITH TIME DELAY INSERTION CIRCUIT

BACKGROUND OF THE INVENTION

The invention relates to an asynchronous circuit insensitive to delays comprising at least one time delay insertion circuit on a signal propagation path.

STATE OF THE ART

An electronic signal processing circuit performs various operations on an input signal modifying this signal. In cryptography, the value of the output signal of a processing circuit is encoded so that nobody apart from authorized persons can access the information. However, monitoring the hidden channels (consumption, electromagnetic radiation, timing) of the electronic circuits can enable the operations performed by the circuit on the signal to be determined. Such types of attacks endanger information integrity and confidentiality. Conventionally, circuits have been developed with countermeasures making attacks on monitoring the consumption of the circuits more difficult.

Figure 1:
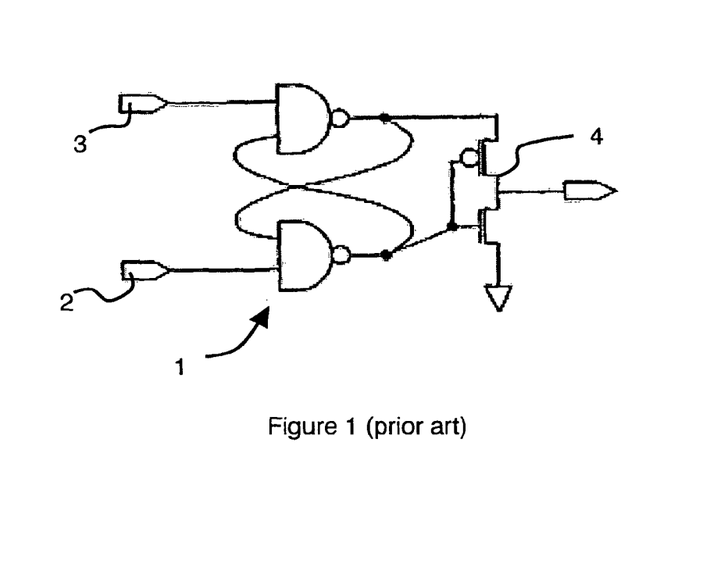
FIG. 1 illustrates a circuit with insertion of a random delay according to the prior art.

U.S. Pat. No. 7,205,794 describes a microprocessor resistant to power analysis using a random delay insertion circuit illustrated in FIG. 1. The circuit comprises an RS flip-flop 1. In FIG. 1, the flip-flop comprises two logic NAND gates each having a first input connected to the output of the other gate. The data is applied on a second input 2 of the first gate constituting a data input of the circuit. Bits of random value are applied on a second input 3 of the second gate constituting a random input of the circuit. A filter is connected to the output of the flip-flop. This filter comprises two transistors, respectively a P-MOS and N-MOS transistor, connected in series between the output of the second gate and ground. The gates of the two transistors are connected directly to the output of the first gate. Random-delay information signals are thereby obtained at the output of the circuit constituted by the common point of the two transistors.

U.S. Pat. No. 6,327,661 describes a type of countermeasure in the cryptography field acting on the internal clock of the circuit by random skipping of certain clock cycles. Random clock skipping can also be performed via software. This type of countermeasure is only applicable to synchronous circuits.

Patent application WO2006/100626 describes an electronic circuit in which an asynchronous timing delay is introduced. An input signal is fed to a control circuit input and, when this signal arrives, the control circuit generates a plurality of signals that are then successively sent to a time delay insertion circuit. When the number of signals processed by the time delay circuit is equal to a predetermined number, the control circuit provides a reply to the input signal. The delay insertion circuit uses the same basic delay circuit which is activated a plurality of times before the control circuit provides a reply to the input signal. Monitoring the power consumption of this type of circuit enables the input signal propagation time to be known. Moreover, the value of the time delay depends on the predetermined number and cannot be modified dynamically.

OBJECT OF THE INVENTION

The object of the invention consists in providing an asynchronous circuit insensitive to delays not having the shortcomings of the prior art and able to resist attacks.

This object is achieved by the fact that the delay insertion circuit comprises a signal input and output, a Muller C-element and a plurality of delay circuits connected in series to an output of the Muller C-element, each delay circuit comprising an output being connected to a corresponding input of a multiplexing circuit, an output of the multiplexing circuit constituting the output of the delay insertion circuit, said Muller C-element comprising an input constituting the input of the delay insertion circuit and an input connected via an inverter gate to the output of the last delay circuit.

According to one embodiment, the asynchronous circuit comprises at least first and second delay insertion circuits connected in series, the output of the first delay insertion circuit being connected to the input of the second delay insertion circuit, the output of the second delay insertion circuit being connected to at least one disable input of the multiplexing circuit of the first delay insertion circuit.

According to another embodiment, the asynchronous circuit comprises at least two delay insertion circuits, the multiplexing circuits of the two delay insertion circuits being connected to a single control circuit.

According to a third embodiment, the asynchronous circuit comprises several independent data signals, each signal being connected to an input of a single delay insertion circuit and to a first input of a corresponding additional Muller C-element, the output of said delay insertion circuit being connected to a second input of each of the additional Muller C-elements.

BRIEF DESCRIPTION OF THE DRAWINGS

Other advantages and features will become more clearly apparent from the following description of particular embodiments of the invention given for non-restrictive example purposes only and represented in the appended drawings in which.

DESCRIPTION OF PREFERRED EMBODIMENTS

Figure 2:
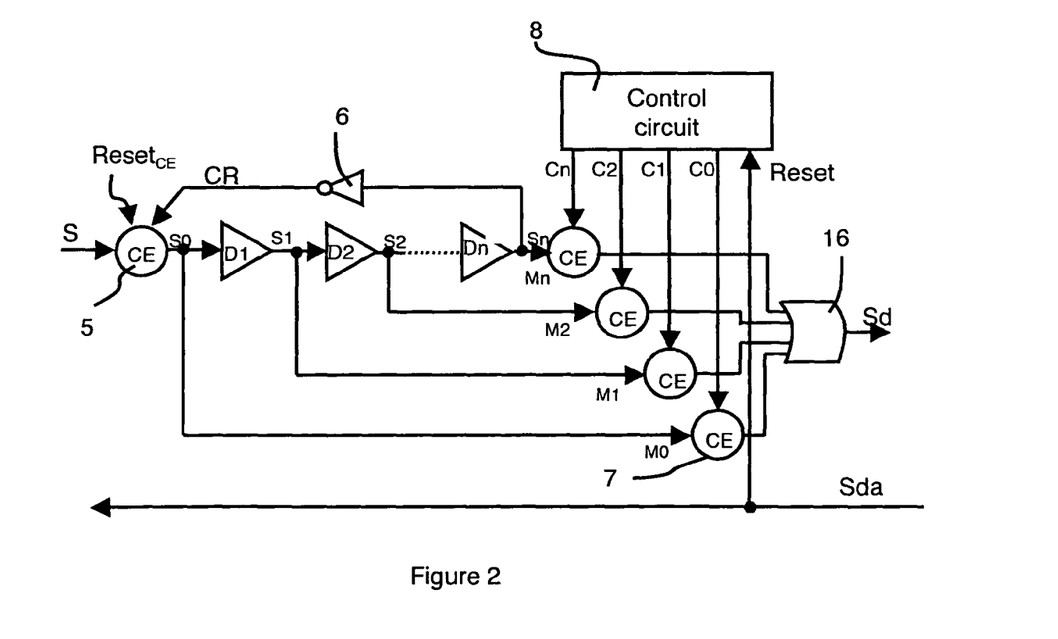
FIG. 2 illustrates a circuit for insertion of a delay in an asynchronous circuit insensitive to delays according to the invention.

In the embodiment illustrated in FIG. 2, the asynchronous circuit insensitive to delays comprises a delay insertion circuit located on the propagation path of a signal S. Between an input S and an output Sd of the signal, the delay insertion circuit comprises a Muller C-element (CE) 5 and a plurality of delay circuits D1 to Dn connected in series to the output S0 of Muller C-element 5, output S0 being connected to the input of delay circuit D1. The respective outputs S1 to Sn of the delay circuits D1 to Dn are connected to corresponding inputs M1 to Mn of a multiplexing circuit having an output which constitutes the delay insertion circuit output Sd. Muller C-element 5 comprises a first input constituting the delay insertion circuit and on which the signal to be processed is applied. A second input of Muller C-element 5 is connected to output Sn of the last delay circuit Dn via an inverter gate 6 so as to receive a feedback signal CR.

The delay circuits can be of any known type and can in particular comprise a series of logic or analog gates (capacitance charging and discharging for example) delaying the signals applied to their input without modifying them.

The truth table of a two-input C-element, also called majority gate, is conventionally the following:

| x | y | z |
|---|---|---|
| 0 | 0 | 0 |
| 0 | 1 | $z_{-1}$ |
| 1 | 1 | 1 |
| 1 | 0 | $z_{-1}$ | x and y representing the gate inputs and z the output. Thus, when the input signals (x and y) of the Muller C-element are identical, the gate is on and the output signal is identical to that of the inputs. When the gate input signals are different on the other hand, the gate is then off and the output remains unchanged ($z=z_{-1}$).

The delay insertion circuit enables a delay to be introduced in the asynchronous circuit. The delay is programable dynamically between a Min value and a Max value for a finite number P of possible values depending on the number of delay circuits. The values Min, Max and P are set when the circuit is designed. The Min value corresponds to the minimum propagation delay of a transition in the delay insertion circuit. The Max value corresponds to the maximum delay able to separate two different successive transitions at the delay insertion circuit output. The Max value depends on the number of delay circuits constituting the delay insertion circuit and corresponds to the sum of the individual delays D1 to Dn of the different delay circuits. Two different successive transitions able to transit in the circuit insensitive to delays are separated at least by a period equal to the Max value.

If the transmission delay of Muller 5 C-element is ignored, the Min value is equal to the value of the delay of the first delay circuit D1. It can be zero, as in the alternative embodiment illustrated in FIG. 2, in which output S0 of Muller C-element 5 is connected not only to the input of the first delay circuit D1 but also to an input M0 of the multiplexing circuit.

The multiplexing circuit can comprise at least one control input corresponding to an output C0 . . . Cn of a control circuit defining the signal to be propagated.

For example, the multiplexing circuit of FIG. 2 is made up of Muller C-elements. Each input M0, M1 . . . Mn, of the multiplexing circuit corresponds to an input of a distinct Muller C-element 7. Each Muller C-element 7 comprises another input constituting a control input of the multiplexing circuit and connected to a corresponding output C0, C1 . . . Cn of a control circuit 8 of the multiplexing circuit. Thus, to enable propagation of a transition, for example a rising transition, with a delay chosen from P possible values comprised between the values Min and Max, the control circuit sets one of its outputs C0, C1 . . . Cn to 1, the others being set to 0.

The outputs of Muller C-elements 7 are connected to corresponding inputs of a logic gate 16 (OR type) whose output constitutes the multiplexing circuit output.

For example, in the embodiment of FIG. 2, all the control signals C0 to Cn are initially set to zero. This can be performed in an initialization phase by means of a zero reset signal applied to a zero reset input (Reset) of control circuit 8.

Making the assumption that input signal S is initially in low state (0), only the feedback signal CR is then at 1. The value of the output of Muller C-element 5 depending on the value of the last signal propagated by the latter, Muller C-element 5 preferably comprises a zero reset input $Reset_{CE}$, this zero reset input of Muller C-element 5 enables the delay insertion circuit to be initialized by setting output S0 of Muller C-element 5 to 0, propagation of this 0 signal in the delay insertion circuit ensures that signal CR is set to 1 and enables all the states on output and on input of the different gates and delay circuits of the delay insertion circuit to be known. Indeed, when propagation of transition 0 reaches the last delay circuit Dn, falling transition 0 is propagated to the input of inverter 6 thereby making feedback signal CR go to 1. A rising transition of input signal S can then be propagated by Muller C-element 5 (S0=1), and then successively by delay circuits D1 to Dn. Signals S0 to Sn then successively take the value 1. After initialization, and preferably before propagation of signal S to Muller C-element 5 on input to the delay insertion circuit, control circuit 8 of the multiplexing circuit sets one only of its outputs C0 to Cn to 1, the others remaining at 0. Each delay circuit thereby transmits the ascending transition of the input signal to the corresponding input M1 to Mn of the multiplexing circuit and to the following delay circuit (D2 to Dn). When the last delay circuit Dn is reached, it propagates the rising transition to the input of inverter 6 thereby making feedback signal CR go to 0. So long as feedback signal CR is at 1, it disables propagation of a falling transition by Muller C-element 5. When it goes to 0, only after propagation of the rising transition to output Sn of the last delay circuit, propagation of a falling transition in the delay insertion circuit can than take place. A subsequent rising transition will only be able to be transmitted after the previous falling transition has been propagated through the delay insertion circuit and feedback signal CR has switched to 1. Feedback signal CR thereby ensures processing of the transitions on input S of the delay insertion circuit with a time interval greater than or equal to the value MAX and makes the delay insertion circuit almost insensitive to delays. The duration of the delay introduced by the delay insertion circuit is a function of the control signal (C0 to Cn), set to 1 for a rising transition, or to 0 for a falling transition, by control circuit 8 of the multiplexing circuit. Multiplexing circuit output signal Sd in fact corresponds to the signal applied to the multiplexing circuit input whose control signal (associated with C0 . . . Cn) is set to 1 in the case of propagation of a rising transition.

To enhance control of the delay insertion circuit when a transition is propagated to delay insertion circuit output Sd, an acknowledge signal Sda can be generated in the asynchronous circuit and applied to zero reset input (Reset) of multiplexing circuit control circuit 8 to modify the state of its outputs C0 to Cn so as to enable a new transition to be propagated with a delay that can be different from the previous delay. Acknowledge signal Sda is preferably also applied to the asynchronous circuit up-line from the delay insertion circuit to enable a new transition of input signal S to be sent to the input of the delay insertion circuit via the asynchronous circuit.

The delay insertion circuit enables the transitions of input signal S or of several signals to be delayed while at the same time keeping a constant power consumption, i.e. whatever the delay time of delayed signal Sd, the amount of power consumed by the delay insertion circuit is the same. This constant consumption is important in the context of use in the field of security and encryption. It is indeed very difficult to determine the value of the delay by monitoring the delay insertion circuit current consumption.

Insertion of this delay in an asynchronous digital circuit insensitive to delays does however enable the current consumption to be modified with respect to the time of the whole of the asynchronous circuit comprising the delay insertion circuit, without however creating data processing dysfunctions.

Modifying the consumption of a circuit presents advantages, in particular as far as noise reduction and cryptography are concerned.

Inserting a variable delay in processing of a signal in an asynchronous circuit thereby enables the generated noise to be reduced (in the substrate, electromagnetic radiation, etc.) by smoothing the current consumption and reducing the current peaks the occurrence of which may give rise to computation errors or damage the circuit. This use is interesting in particular in the automobile, avionics, and medical fields.

Multiplexing circuit control circuit 8 can comprise a random generator for the purposes of enabling a random choice of the delay to be applied to signal S before propagation of the latter in the asynchronous circuit on output Sd of the delay insertion circuit. Thus, when the multiplexing circuit control circuit is equipped with a random or pseudo-random generator, this enables a random or pseudo-random current consumption of the asynchronous circuit. The random or pseudo-random consumption protects the asynchronous circuit against power attacks or electromagnetic attacks.

The current flowing in a circuit does in fact induce an electromagnetic radiation in proximity to the circuit. As the consumption of a circuit varies during data processing, power analysis or electromagnetic analysis of this circuit enables secret or at least confidential data to be extracted.

In known manner, analysis of Single Power Analysis (SPA) type and derivatives thereof, called Side Channel analysis, consists in observing the variations of the global electric power consumption of the circuit and in then identifying the data. This type of analysis gives better results if the hardware architecture is known. For example, an increase of the circuit consumption can indicate that a modular exponentiation operation is in progress.

Differential Power Analysis (DPA), and derivatives thereof such as CPA and higher order DPA also called Side Channel analysis, is more sophisticated than the previous analysis. It is based on statistical analysis. Several executions of the same algorithm enable statistical extraction of the desired information.

Attack by Differential Electromagnetic Analysis (DEMA), and its derivatives is based on the same techniques as SPA and DPA analysis, but the physical quantities measured are different. In the case of DEMA attacks, it is the electromagnetic radiations emitted by the circuit tracks that are targeted.

Another type of electromagnetic attack consists in positioning a probe in proximity to the surface of the circuit and in locally measuring the magnetic field to deduce the signals circulating in proximity to this probe.

Random delay insertion in an asynchronous circuit constitutes a barrier against attacks monitoring the consumption and electromagnetic radiations of a circuit. This is in particular interesting in processing loops such as arithmetic computations, state machines, microprocessors or micro-controllers, encryption circuits such as Data Encryption Standard (DES), Advanced Encryption Standard (AES) or the Rivest-Shamir-Adleman (RSA) algorithm, etc.

According to an alternative embodiment, each delay circuit Di (D1 to Dn) of the delay insertion circuit can propagate a signal with a delay either in symmetric or asymmetric manner. Naturally, in one and the same delay insertion circuit, it is possible to have asymmetric delay circuits and symmetric delay circuits.

A delay is said to be symmetric when it delays a rising transition and a falling transition in the same way.

Figure 3:
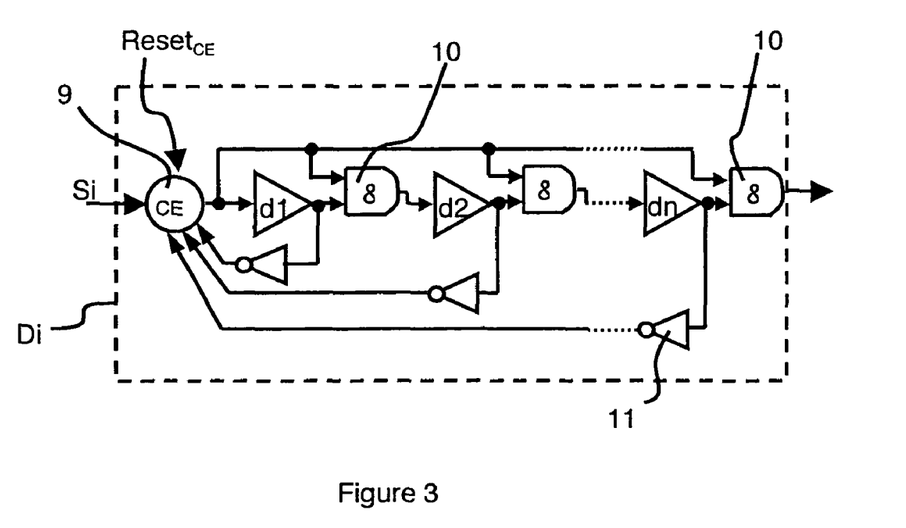
FIGS. 3 and 4 illustrate alternative embodiments of a delay circuit of a delay insertion circuit according to FIG. 2.

A delay is said to be asymmetric when the rising and falling transitions are delayed differently. Thus for example, an asymmetric delay circuit Di, as illustrated in FIG. 3, comprises an input Si formed by an input of a Muller C-element 9 comprising a zero reset input $Reset_{CE}$ of the output signal of the Muller C-element 9 having the same functions as the zero reset input of Muller C-element 5 on input to the delay insertion circuit. The output of Muller C-element 9 is connected directly to a first input of an AND gate 10 and to a second input of logic AND gate 10 by means of a delay cell d1 (elementary logic gate or capacitor for example). Delay circuit Di can comprise a plurality of gates 10 connected in series each having a first input connected to the output of Muller C-element 9. A second input of each gate 10 is connected to the output of the previous gate (Muller C-element 9 for first gate 10, previous gate 10 for the others) by means of a delay cell (d1 . . . dn). The output of each delay cell (d1 . . . dn) is connected to a corresponding input of Muller C-element 9 by means of a corresponding inverter 11. The output of the last gate 10 constitutes the output of delay circuit Di. Thus, for falling transitions of input signal Si, the delay is quasi-nil (the output signal of Muller C-element 9 applying a 0 signal to the first input of each gate 10 thus makes the output of the last gate 10 be set to 0) and only depends on the intrinsic propagation delays of the Muller C-element and of the AND gate, whereas for rising transitions the delay is equal to the sum of the delays corresponding to cells d1 to dn. According to an alternative embodiment illustrated in FIG. 4, only three logic gates (d1, d2, d3) are represented and there is no feedback between the output of gate d3 and Muller C-element D9, and the output of delay circuit Di is formed by the output of delay cell d3. In this case, the delay circuit delays the rising transitions by d1+d2+d3 and the falling transitions by d3.

Figure 4:
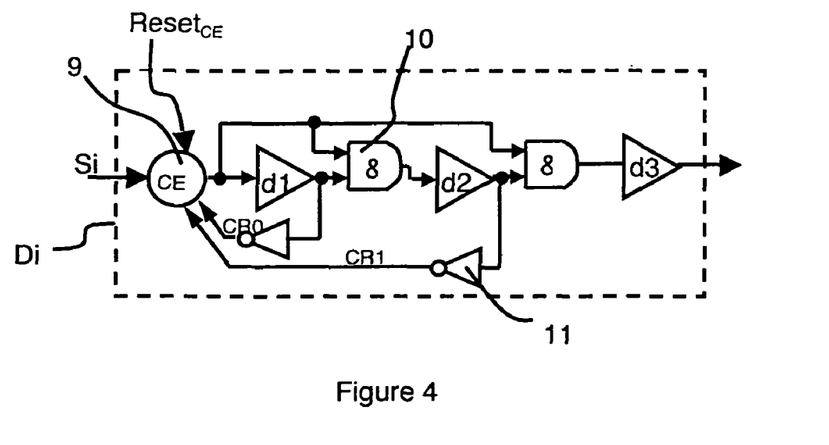

In the example embodiments of delay cells with asymmetric delay of FIGS. 3 and 4, there is a paralleling of processing of a falling transition. Indeed, a falling transition propagates simultaneously to the first input of all the gates 10 and successively to the input of each delay cell (d1 . . . dn). The feedbacks to the inputs of Muller C-element 9 ensure quasi-insensitivity to delays and do not let a new transition pass so long as the previous transition is still flowing in the delay circuit. In both cases, the power consumption remains constant regardless of the values chosen for the time delays.

Naturally, the above examples of producing an asymmetric delay circuit are non-restrictive and a delay circuit Di can use any type of known logic delay cell (gate array, etc.) or analog delay cell (capacitance charging and discharging).

Figure 5:
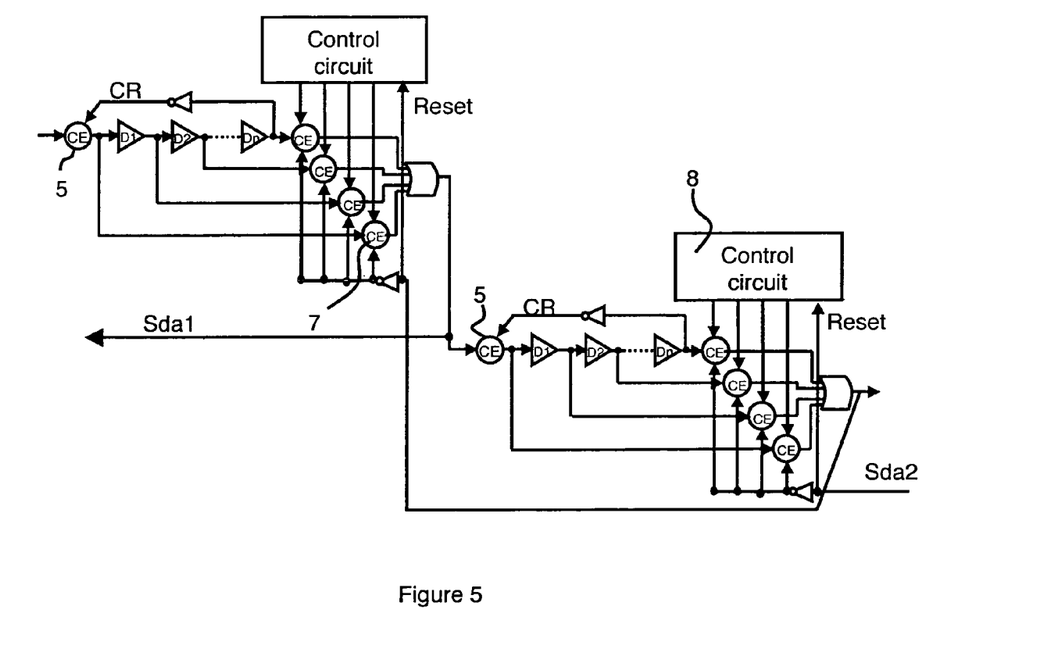
FIG. 5 illustrates a delay insertion circuit with a dual-rail pipeline structure.

To increase the throughput to the input regardless of the values Min, Max and P, it is possible to connect at least two delay insertion circuits in series (pipeline structure). For example, FIG. 5 comprises two delay insertion circuits according to FIG. 2 connected in series, the output of a first delay insertion circuit being connected to the input of a second delay insertion circuit. The value Min then corresponds to the sum of the minimum delays of each delay insertion circuit and the value Max to the sum of the longest delays for each delay insertion circuit. The output of the second delay insertion circuit is connected to at least one disable input of the first circuit used to disable propagation of the signal from the first delay insertion circuit to the second delay insertion circuit so long as the signal has not been propagated to the output of the second circuit. This disabling is preferably achieved by feedback between the output of the second delay insertion circuit and the first delay insertion circuit. The output of the first delay insertion circuit is connected to an input of the asynchronous circuit to which it belongs, enabling propagation of an acknowledge signal Sda1 to the asynchronous circuit to inform the latter that the signal has in fact been propagated by the first delay insertion circuit and that this first delay insertion circuit is ready to receive a new transition on the input of its Muller C-element 5. In the particular embodiment of FIG. 5, the output of the second delay insertion circuit is connected directly to the control circuit 8 and by means of an inverter to an additional input of each Muller C-element 7 of the first delay insertion circuit multiplexing circuit. A transition is thus not presented to the input of the second delay insertion circuit until the transition being propagated in the latter has been propagated to its output. In this particular embodiment, Muller C-elements 7 of each multiplexing circuit preferably comprise a zero reset input (not shown), this reset input resetting the output of the Muller C-elements 7 concerned to 0 (following the same principle as the reset input of Muller C-element 5). When the outputs of the multiplexing circuit Muller C-elements 7 of the second delay insertion circuit are set to 0, the 0 transition is propagated to the first delay insertion circuit by means of the inverter on each additional input of Muller C-elements 7 of the first delay insertion circuit, setting the corresponding additional inputs to 1. Likewise, propagation of the 0 transition to the output of the second delay insertion circuit to the asynchronous circuit to which it belongs is acknowledged in the second delay insertion circuit by a signal Sda2 propagated to the additional input of each multiplexing circuit Muller C-element 7 of the second delay insertion circuit by means of an inverter to set each corresponding additional input to 1. Zero resetting of Muller C-elements 7 of the first delay insertion circuit ensures that none of the outputs of Muller C-elements 7 is at 1, which would result in propagation of this signal in the second delay insertion circuit (undetermined state of the signals in the circuit). The pipeline is thus initialized and is ready to receive a 1 transition on its input to propagate it. This zero resetting enables the pipeline to be initialized and prevents an indeterminate state from being had in the pipeline.

In general manner, for each delay insertion circuit and its components to be placed in a stable state, the different reset signals are applied for a certain time until a stable global state of the circuit is obtained.

Figure 6:
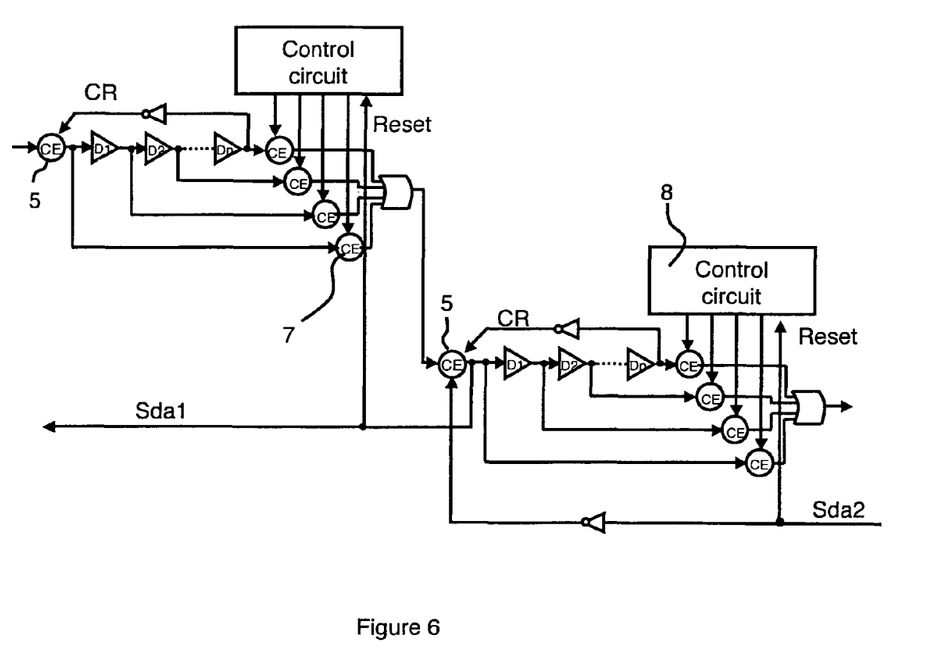
FIG. 6 illustrates an alternative embodiment of a pipeline structure according to FIG. 5.

In another alternative embodiment illustrated in FIG. 6, the link conveying the second delay insertion circuit acknowledge signal Sda2 is connected directly to control circuit 8 and to an additional input of second delay insertion circuit Muller C-element 5 by means of an inverter to provide the feedback preventing propagation of a new signal so long as the previous signal has not been propagated. The link conveying the first delay insertion circuit acknowledge signal Sda1 is no longer connected to the output of the first delay insertion circuit multiplexing circuit but to the output of the second delay insertion circuit Muller C-element 5. Likewise, the output of the second delay insertion circuit Muller C-element 5 is connected to reset input (Reset) of the first delay insertion circuit multiplexing circuit.

In another alternative embodiment (not shown), an additional Muller C-element performing feedback can be added between the output of the first delay insertion circuit multiplexing circuit and the input of the second delay insertion circuit Muller C-element.

The alternative embodiments described above are naturally example embodiments only. The pipeline structure can be achieved in various different ways so long as the basic principles, i.e. knowing the different states of the circuits and sending a new transition to a delay insertion circuit only when the previous transition has left said delay insertion circuit, are complied with.

The number of delay insertion circuits connected in series can be more than two, feedback between the output of each delay insertion circuit and the previous delay insertion circuit multiplexing circuit guaranteeing disabling of the transition to the input of said previous delay insertion circuit until this transition has been transmitted to its output.

On the principle pipeline, it is naturally possible to connect a plurality of delay insertion circuits in series.

Figure 7:
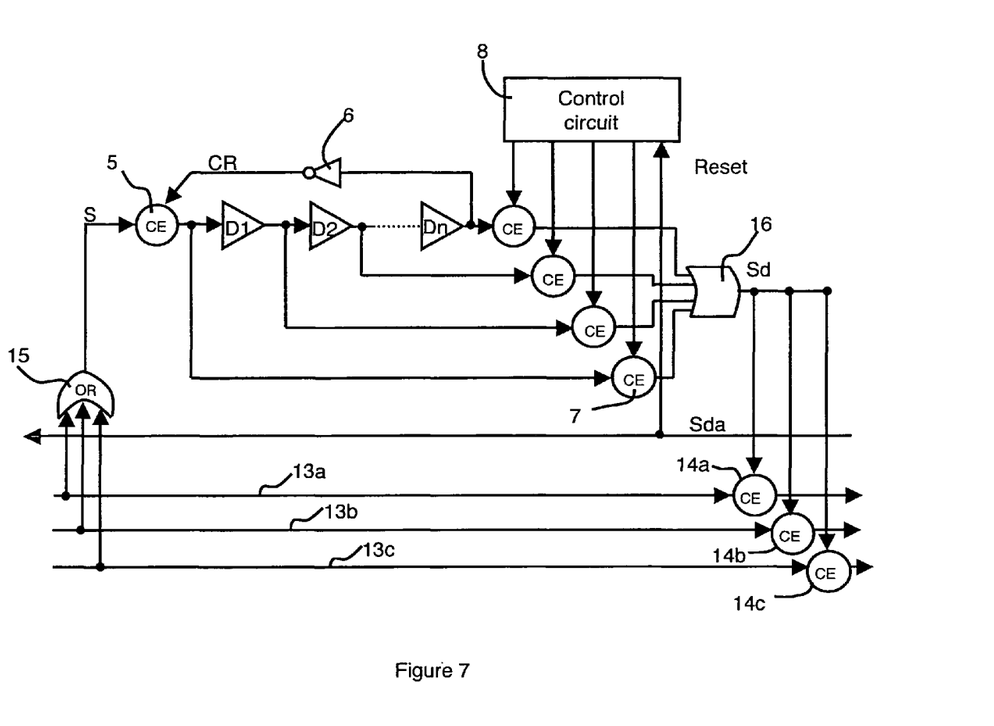
FIG. 7 illustrates a circuit for insertion of a delay in a multi-rail asynchronous circuit.

As illustrated in FIG. 7, the delay insertion circuit of FIG. 2 can be used in an asynchronous circuit with a multi-rail channel using 1 from n encoding. The multi-rail channel comprises several independent data signals 13 (three signals in FIGS. 6, 13a, 13b and 13c). Each signal 13 is connected to a first input of a corresponding Muller C-element 14 (14a, 14b, 14c). A single delay insertion circuit, illustrated in FIG. 2, is used to delay the signals. Delay insertion circuit output Sd is connected to a second input of each Muller C-element 14. Upstream from the Muller C-elements, each signal 13 is connected to delay insertion circuit input S via a single logic OR gate 15. 1 from 3 encoding here implies that, at a given moment, only one of the signals conveys a rising transition. To reinitialize the delay insertion circuit between each change of propagation signal of a 1 transition, the asynchronous circuit generates an acknowledge signal Sda, this signal setting all the signals to 0 and enabling the 0 transition to be propagated by the OR gate and then into the delay insertion circuit enabling input CR of Muller C-element 5 to be set to 1.

Figure 8:
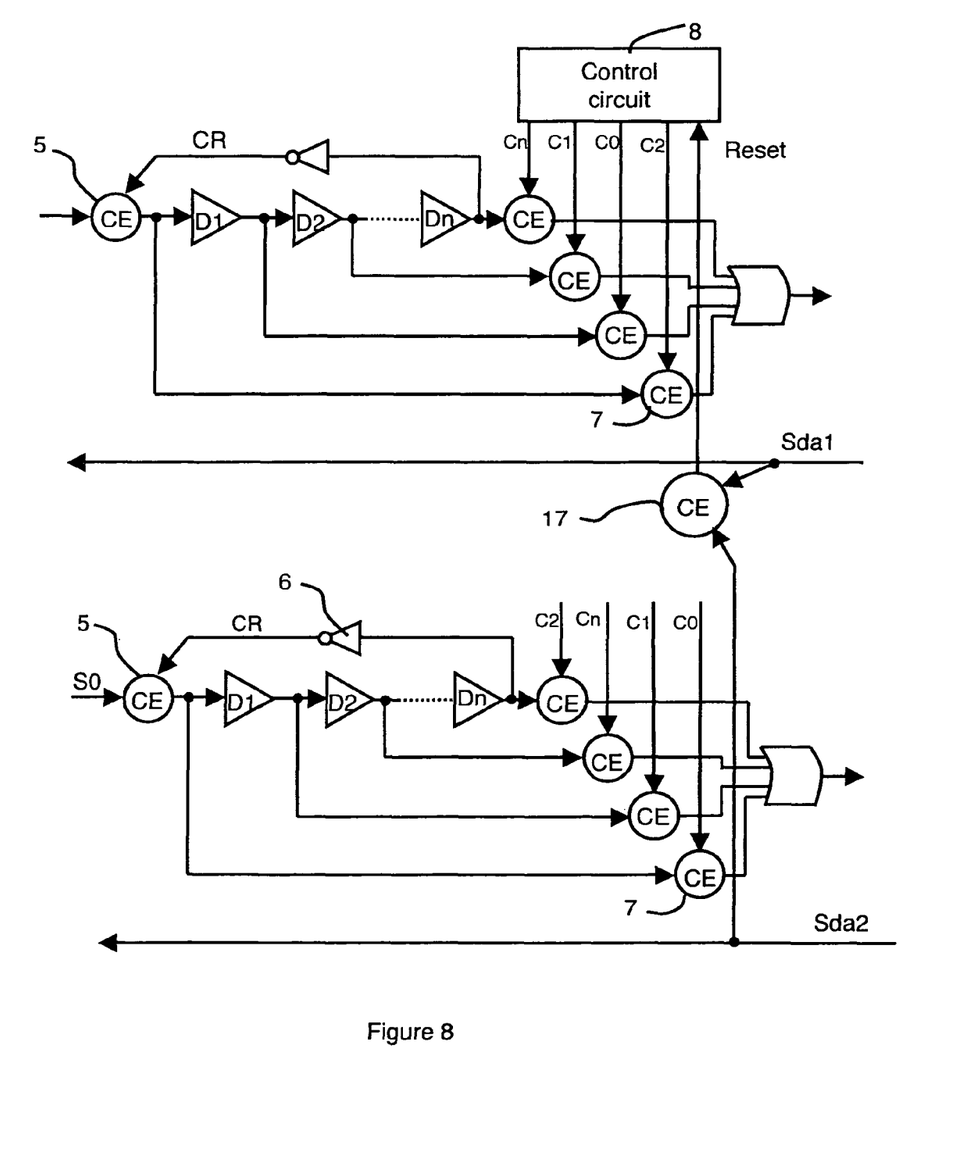
FIG. 8 illustrates application of a delay to several channels with pooling of the controller.

In an alternative embodiment, several delay insertion circuits according to FIG. 2 can share the same control circuit 8 which controls the two multiplexing circuits of the delay insertion circuits, switching the connections (C0 . . . Cn) between control circuit 8 and the different Muller C-elements 7 of the multiplexing circuits of the two delay insertion circuits. In the embodiment illustrated in FIG. 8, Muller C-element 7 of the multiplexing circuit of the top insertion circuit corresponding to delay D1 comprises an input connected to controller output C0 whereas this same controller output C0 is connected to Muller C-element 7 corresponding to a quasi-nil delay of the multiplexing circuit of the bottom delay insertion circuit. In addition, outputs C1, C2 and Cn of control circuit 8 are respectively connected to the input of Muller C-elements 7 connected to the output of delay circuit D2, of Muller C-element 5 and of delay circuit Dn of top delay insertion circuit, and to the input of the Muller C-elements connected to the output of delay circuits D1, Dn and D2 of the bottom delay insertion circuit. Zero reset input (Reset) of control circuit 8 is connected to an output of a Muller C-element 17 comprising as many inputs as delay insertion circuits associated with control circuit 8. Acknowledge signals Sda1 and Sda2 corresponding to validation by the asynchronous circuit of the transitions by each of the delay insertion circuits are applied to the corresponding inputs of Muller C-element 17. A new transition is thereby only sent to each of the delay insertion circuits after propagation of the previous transition with the highest delay.

In all cases, logic production of the delay generated by the delay insertion circuit is such that the delay is performed regardless of the delays of the gates, wires and isochronous forks (signal diffusion in two distinct branches) that constitute the circuit that is quasi-insensitive to delays. The actual time delay can therefore be fluctuating, but all the transitions presented on the input of the delay insertion circuit are delayed and produced at the output of the delay insertion circuit without any loss.

The invention is not limited to the example embodiments described above. In particular, the random or cyclic delay insertion circuit can be used in any type of asynchronous circuit insensitive to delays, in particular for applications requiring a noise reduction or in security applications using encryption circuits.

Inserting time delays in an asynchronous circuit insensitive to delays guarantees satisfactory operation even in the presence of disturbances on the latency of the wires and gates.

The invention claimed is:

1. An asynchronous circuit insensitive to time delays comprising at least one delay insertion circuit on a signal propagation path, wherein the delay insertion circuit comprises, between an input and an output of the signal, a Muller C-element and a plurality of delay circuits connected in series to an output of the Muller C-element, each delay circuit comprising an output connected to a corresponding input of a multiplexing circuit, an output of the multiplexing circuit constituting the output of the delay insertion circuit, said Muller C-element comprising an input constituting the input of the delay insertion circuit and an input connected by means of an inverter gate to the output of the last delay circuit.

2. The asynchronous circuit according to claim 1, wherein the multiplexing circuit comprises at least one control input connected to a control circuit comprising a random or pseudo-random generator.

3. The asynchronous circuit according to claim 1, wherein the delay circuits of the delay insertion circuit are of symmetric and/or asymmetric type.

4. The asynchronous circuit according to claim 1, comprising at least first and second delay insertion circuits connected in series, the output of the first delay insertion circuit being connected to the input of the second delay insertion circuit, the output of the second delay insertion circuit being connected to at least one disable input of the multiplexing circuit of the first delay insertion circuit.

5. The asynchronous circuit according to claim 1, comprising at least two delay insertion circuits, the multiplexing circuits of the two delay insertion circuits being connected to a single control circuit.

6. The asynchronous circuit according to claim 1, comprising several independent data signals, each signal being connected to an input of a single delay insertion circuit and to a first input of a corresponding additional Muller C-element, the output of said delay insertion circuit being connected to a second input of each additional Muller C-element.

* * * * *